(12) United States Patent
Nandakumar

(10) Patent No.: US 12,107,117 B2
(45) Date of Patent: Oct. 1, 2024

(54) HIGH RESISTANCE POLY RESISTOR

(71) Applicant: TEXAS INSTRUMENTS INCORPORATED, Dallas, TX (US)

(72) Inventor: Mahalingam Nandakumar, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 18/094,088

(22) Filed: Jan. 6, 2023

(65) Prior Publication Data

US 2023/0141752 A1 May 11, 2023

Related U.S. Application Data

(62) Division of application No. 16/800,002, filed on Feb. 25, 2020, now Pat. No. 11,588,008.

(60) Provisional application No. 62/915,752, filed on Oct. 16, 2019, provisional application No. 62/811,957, filed on Feb. 28, 2019.

(51) Int. Cl.
| | |
|---|---|
| *H01L 21/8234* | (2006.01) |
| *H01L 23/525* | (2006.01) |
| *H01L 27/06* | (2006.01) |
| *H01L 29/76* | (2006.01) |
| *H01L 49/02* | (2006.01) |

(52) U.S. Cl.
CPC ...... *H01L 28/20* (2013.01); *H01L 21/823437* (2013.01); *H01L 21/823475* (2013.01); *H01L 23/5258* (2013.01); *H01L 27/0629* (2013.01)

(58) Field of Classification Search
CPC ................................ H01L 28/20; H01L 28/24
See application file for complete search history.

(56) References Cited

U.S. PATENT DOCUMENTS

| | | | |
|---|---|---|---|
| 5,151,611 A | 9/1992 | Rippey | |
| 5,821,765 A | 10/1998 | Ling et al. | |
| 6,083,785 A | 7/2000 | Segawa et al. | |
| 2011/0309466 A1 | 12/2011 | Nanba | |

*Primary Examiner* — John A Bodnar
(74) *Attorney, Agent, or Firm* — Andrew R. Ralston; Frank D. Cimino

(57) ABSTRACT

An integrated circuit includes a polysilicon resistor having a plurality of segments, including first, second and third segments, the second segment located between and running about parallel to the first and third segments. A first header connects the first and second segments, and a second header connects the second and third segments. A first metal silicide layer located over the first header extends over the first and second segments toward the second header. A second metal silicide layer located over the second header extends over the second and third segments toward the first header. A dielectric layer is located over and contacts the first, second and third segments between the first and second metal silicide layers.

18 Claims, 8 Drawing Sheets

SECTION 2-2

SECTION 3-3

SECTION 4-4

SECTION 5A-5A

SECTION 5B-5B

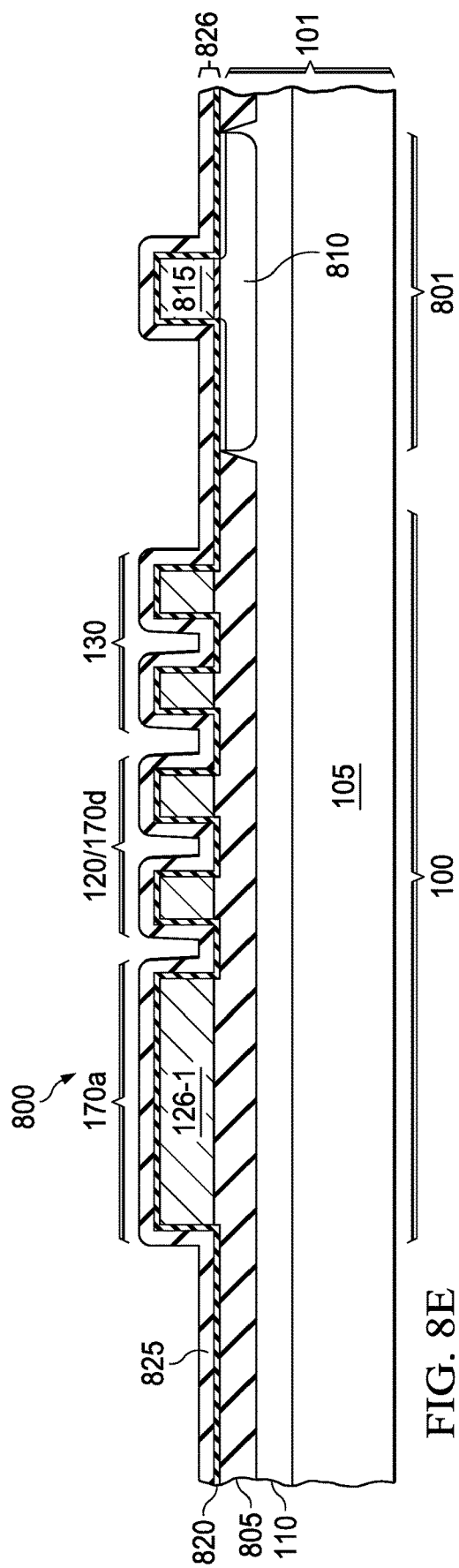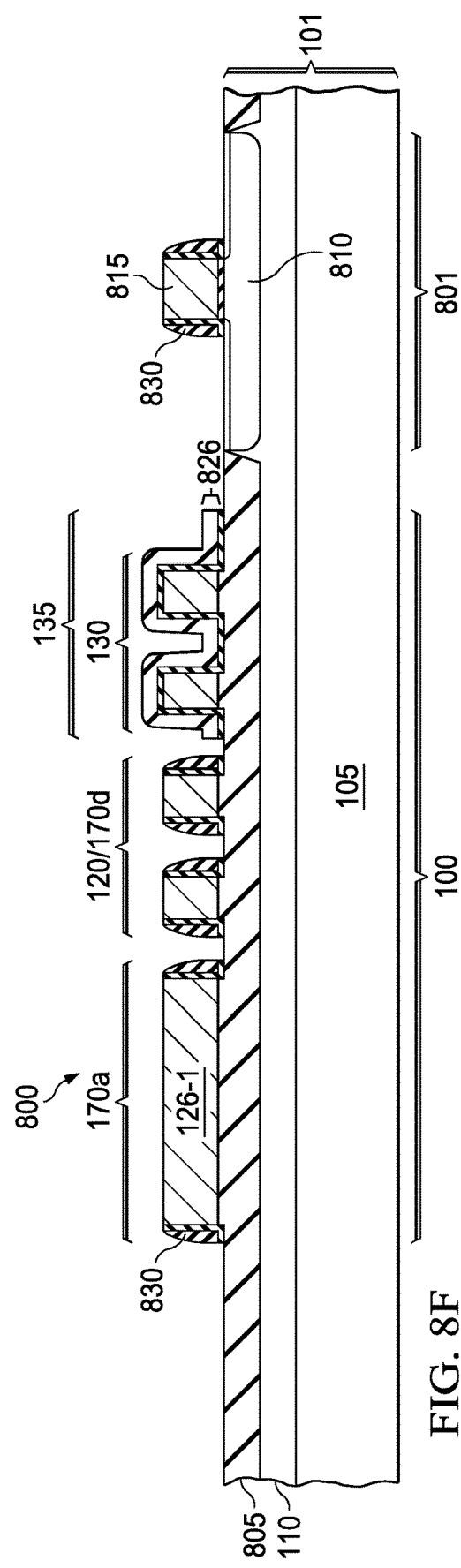

HIGH RESISTANCE POLY RESISTOR

CROSS REFERENCE TO RELATED APPLICATIONS

This application claims the benefit of Provisional Application Ser. No. 62/811,957 filed Feb. 28, 2019 and 62/915,752 filed Oct. 16, 2019, both entitled "High Resistance Poly Resistor", both of which are incorporated herein by reference in their entireties. This application is a divisional of U.S. Pat. No. 11,588,008, issued Feb. 21, 2023, which is incorporated herein by reference in its entirety.

FIELD

This disclosure relates to the field of semiconductor devices, and more particularly, but not exclusively, to resistive devices, e.g. serpentine polysilicon resistors with high resistance.

BACKGROUND

Polysilicon resistors are used in a wide variety of integrated circuit applications. Such resistors may be used to implement various circuits, such as amplifiers, oscillators, and filters. Variation of the value of a design resistor in different locations of a semiconductor wafer may result in some devices on the wafer being unusable, resulting is yield loss. Therefore improvement of resistor uniformity is a continuing critical need in semiconductor manufacturing.

SUMMARY

In one example embodiment, an integrated circuit includes a polysilicon resistor having a plurality of segments, including first, second and third segments, the second segment located between and running about parallel to the first and third segments. A first header connects the first and second segments, and a second header connects the second and third segments. A first metal silicide layer over the first header extends over the first and second segments toward the second header. A second metal silicide layer over the second header extends over the second and third segments toward the first header. A dielectric layer is located over and contacts the first, second and third segments between the first and second metal silicide layers. Other example embodiments include methods of forming the integrated circuit.

BRIEF DESCRIPTION OF THE VIEWS OF THE DRAWINGS

FIGS. 8A-8H are section views of an electronic device, e.g. an integrated circuit, including the resistor of FIG. 1, at various stages of fabrication according to various embodiments.

DETAILED DESCRIPTION

Figure 1:
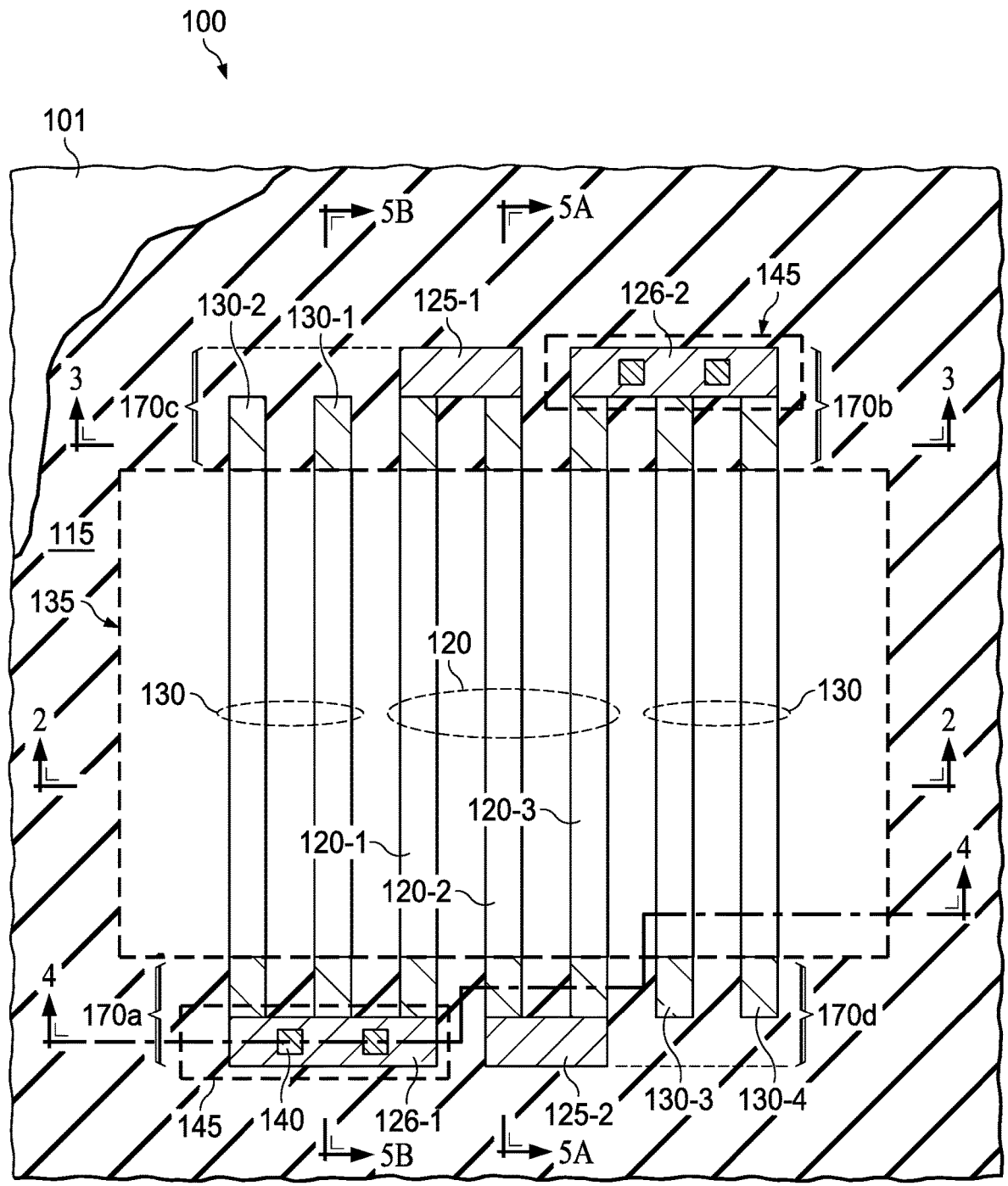
FIG. 1 illustrates a plan view of a representative polysilicon resistor according to various embodiments described herein, with section cutlines shown corresponding to FIGS. 2, 3, 4 and 5.

The present disclosure is described with reference to the attached figures. The figures may not be drawn to scale and they are provided merely to illustrate the disclosure. Several aspects of the disclosure are described below with reference to example applications for illustration, in which like features correspond to like reference numbers. It should be understood that numerous specific details, relationships, and methods are set forth to provide an understanding of the disclosure. The present disclosure is not limited by the illustrated ordering of acts or events, as some acts may occur in different orders and/or concurrently with other acts or events. Furthermore, not all illustrated acts or events may be required to implement a methodology in accordance with the present disclosure.

This application discloses various methods and devices that may be beneficially applied to manufacturing integrated circuits (ICs) including polysilicon resistors with improved manufacturing consistency, e.g. reduced variation of resistance between nominally identical resistors formed on different die of a manufacturing lot. While such embodiments may be expected to provide improvements in manufacturing yield and/or reduce the need for resistor trimming, no particular result is a requirement of the described invention(s) unless explicitly recited in a particular claim.

Some integrated circuit resistors are fashioned from polysilicon lines formed over a substrate in a same material layer used to form transistor gate electrodes. One example class of such resistors is "zero temperature-coefficient of resistance" (ZTCR) resistors. Such resistors may include a serpentine path formed in polysilicon. It is generally preferable that such resistors have a small variability of resistance among nominally identical resistors within a same device, or among resistors fabricated on different devices (die) in a process lot.

One source or potential variability is variation of linewidth of the lines, typically arranged as parallel resistor segments, with adjacent segments joined by a header, or "turn". In some cases, particularly for minimum-geometry linewidth and line spacing, lines in the interior of the resistor may have a different cross-sectional area than lines at the edges of the resistor. Such variation may be caused by, e.g. optical effects and non-uniform etching at the boundaries of the structure. Another source of variability is the headers that connect the resistor segments. At the transition from the line segments to the header, the line width may deviate considerably from drawn line width, again due to optical and etch process effects. While this effect may be mitigated by, e.g. a header design that does not use minimum design rule geometries, such a strategy may undesirably result in a larger resistor size.

The inventor has determined that the variability of resistance of polysilicon resistors formed from closely-spaced lines may be significantly reduced by one or both of two solutions. First, variation of the width of outermost lines of the resistor may be reduced by adding "dummy" lines adjacent the outermost resistor segments. Such lines may be nominally identical to the resistive segments, e.g. having a same drawn linewidth and spacing, but are not connected to the resistor terminals. Second, the contribution of the headers joining adjacent segments may be excluded from the resistance of the resistor by forming a metal silicide on the headers, thereby reducing the resistance of the headers. Silicide may be excluded from an interior portion of the resistor segments sufficient to ensure the resistance of the resistor is dominated by the interior portion, thereby rendering the variation of the headers insignificant. Resistors formed consistent with these principles are expected to have significantly reduced variability relative to baseline resistors that do not employ either of these solutions.

FIG. 1 illustrates an example resistor 100 that include various features consistent with the disclosure. The resistor 100 is located over a substrate 101, with a dielectric layer 115 located therebetween. The substrate 101 may include a silicon substrate, but other semiconductor or insulating substrates are contemplated, e.g. GaAs or sapphire. The dielectric layer 115 may be any appropriate material, e.g. silicon oxide, silicon nitride or silicon oxynitride. If the substrate 101 is sufficiently insulating, the dielectric layer 115 may be omitted.

The resistor 100 includes a number of linear resistor segments 120 and dummy segments 130 formed over the substrate 101. The segments 120, 130 may be arranged as a regular array of segments spaced apart about uniformly and being about parallel to each other. In the present context, "about parallel" means the segments form an angle with respect to each other no greater than 5°. While it may be preferred that the segments 120, 130 be linear and regularly spaced, embodiments are contemplated in which such segments are neither linear nor regularly spaced. Each of the segments 120, 130 extends laterally parallel to the substrate 101 surface in a first direction to a greater extent than a second orthogonal direction. The first direction may be referred to herein as a "long axis" and the second direction may be referred to as a "short axis". In the following discussion individual instances of the segments 120 and 130 may be respectively designated 120-1 through 120-3, and 130-1 through 130-4 for clarity. The width of the segments 120, 130 and the spacing between them is not limited to any particular value, but it is expected that the principles described herein will provide particular benefit for resistors formed with submicron linewidth and spacing, e.g. a width and spacing of 0.5 μm or smaller.

The segments 120 are connected directly or indirectly to terminals 126, referred to individually as terminals 126-1 and 126-2. In the illustrated embodiment, the segment 120-1 is connected to the terminal 126-1, the segment 120-3 is connected to the terminal 126-2, and the segment 120-2 is connected between the segments 120-1 and 120-3. The segment 120-2 is connected to the segment 120-1 by a header 125-1, and is connected to the segment 120-3 by a header 125-2. Herein, a "header" is a conductive structure that conductively connects to two or more segments at a same conductor material level, that may have a long axis about orthogonal to the long axes of the segments to which it is connected, and may terminate at one or more of the segments to which it is connected. A "terminal" is a conductive structure connected to an end segment, wherein an "end segment" is a last current-carrying segment in an array of segments. Typically, such an array will include two end segments, and may include one or more interior segments between the end segments. Typically, a terminal may be a discrete structural feature, e.g. a conductive portion with a long axis oriented orthogonal to the long axis of the connected segment. Moreover, one or more conductive vias may electrically connect the terminal to another conductive interconnect level for connection to other circuit components. In the present context, "connected" means the segments are portions of a continuous material layer, and are portions of a continuous conductive path between the terminals 126-1 and 126-2. While the segments 120 are shown as connected in series, in other example some segments may be connected in parallel, as long as the network of segments includes two nodes respectively connected to the terminal 126-1 and the terminal 126-2. The terminals 126-1 and 126-2 may be considered headers with respect to the last segments of the continuous conductive path, e.g. the segments 120-1 and 120-3.

In the present example, the dummy segments 130 are connected at one end only to one of the terminals 126, and thus do not contribute to the resistance of the resistor 100. As used herein, the term "dummy segment" is defined as a conductive segment at a same conductor material level as the segments 120, sometimes having at least about a same length as the dummy segments, and being spaced apart from each other and an adjacent segment 120 by about a same lateral distance by which the segments 120 are spaced apart from each other. Moreover, a dummy segment is not connected in a current path through the segments 120 between terminals of the resistor of which the segments are a part, e.g. the terminals 126. In the illustrated example, segments 130-1 and 130-2 are connected to the terminal 126-1 and segments 130-3 and 130-4 are connected to the terminal 126-2. In some other implementations, not shown, at least one of the dummy segments is electrically floating, e.g. is not connected to either of the terminals 126. In yet other implementations in which there are multiple adjacent dummy segments, an end of the segments may be joined by a header that does not conduct current through the resistor. Such a header may be referred to as a "dummy header". Each of the segments 130 has a first end and a second end. Only one of the ends, e.g. the first end, of each segment 130 is directly connected to a corresponding terminal 126. By "directly connected", it is meant that no length of the segment 130 lies between the connected end and the corresponding terminal 126. In contrast, an opposite end of each segment 130 is unconnected, in that the opposite end is only connected to a corresponding terminal 126 via the length of the segment 130.

In the illustrated example, the resistor 100 includes metal interconnect lines 145 (shown in outline) connected to the terminals 126 by vias 140, sometimes referred to as contacts at this level. The interconnect lines 145 may connect the terminals 126 to electronic devices, e.g. transistors, in an integrated circuit to provide an electrical function such as, without implied limitation, amplification, filtering, or frequency generation.

The segments 120 and 130 may be formed from polysilicon, and are generally described as such herein. However, the scope of the disclosure includes alternative materials that may be currently known or developed in the future. For example, alternative resistive films may include Ge or SiGe. Such contemplated alternatives are able to form a compound with an appropriate metal such that the compound has a resistivity substantially less than, e.g. no greater than about 10%, the resistivity of the resistive material. The segments 120 and 130 may be formed from any available polysilicon layer (or alternative resistive film) in a particular semiconductor technology. For example, some flash memory technologies include multiple polysilicon layers, any of which may be suitable for forming the segments 120 and 130.

Furthermore the segments 120 and 130 may be doped, and when doped are not limited to any particular doping level or type. More specifically, while the described principles may be beneficially applied to some particular resistor types, such as ZTCR resistors, implementations of these principles are not limited to such applications.

A dielectric layer 135, shown in the present view in dashed outline, lies over the segments 120 and 130. In some other implementations the dielectric layer 135 optionally does not extend over the segments 130. The dielectric layer 135 may be referred to herein as a SiBLK layer, reflecting that this layer may be used to prevent the formation of a metal silicide on portions of the segments 120 and 130 over which the dielectric layer 135 is located. As described further below the SiBLK layer 135 may be a single dielectric layer or may include two or more sublayers, with the sublayers having a different chemical composition. In the illustrated embodiment, within the dashed outline of the SiBLK layer 135 the segments 120, 130 are shown unshaded, indicating that no silicide is present in these locations. Portions of the segments 120 and 130, the headers 125 and the terminals 126 are shaded outside the outline of the SiBLK layer 135, indicating that silicide is present at these locations. Additional details are elucidated below in sectional diagrams in FIGS. 2, 3, 4 and 5 corresponding to cutlines are shown in FIG. 1. While examples are described with reference to silicon with respect to the segments 120 and 130, and "silicide", or a compound between silicon and a metal, the disclosure contemplates different materials used for the segments 120, 130 as previously described, and therefore also contemplates materials other than a silicon-based compound as the low-resistivity portion of the shaded regions.

Before discussion of the sectional diagrams, some aspects of the resistor 100 are described that result from the illustrated arrangement. First, those skilled in the pertinent art will appreciate that because the headers 125, the terminals 126, and the portions of the segments 120 outside the SiBLK layer 135 are silicided, the resistance of these regions of the resistor 100 will be significantly less than the resistance of the segments 120 within the perimeter of the SiBLK layer 135. Thus the resistance between the terminals 126-1 and 126-2 will be dominated by the series resistance of the portions of the segments 120 lacking silicide. Therefore the headers 125, which otherwise might be a significant source of resistance variability, are effectively excluded from the resistance of the resistor 100.

Second, while the segments 130 do not contribute to the resistance between the terminals 126, they may reduce linewidth variation of the segments 120 by their presence during photolithographic exposure of a resist layer used to pattern the polysilicon layer from which both the segments 120 and 130 are formed. While two segments 130 are present on either side of the segments 120 in the illustrated example, in some other examples there may be a single segment 130 on each side of the segments 120, or there may be more than two segments 130 on one or both sides. Preferably the number of segments 130 is no greater than needed to provide consistent linewidth of the segments 120 to avoid unnecessary consumption of die area. In many cases two segments 130 on both sides of the segments 120 is expected to be sufficient for this purpose.

The inventors have determined that resistors formed using one or both of these techniques may advantageously have greater consistency of resistance across a manufacturing wafer then similar conventional resistors that lack these features. In embodiments that include both features (dummy resistor segments and silicide outside the SiBLK window), especially advantageous consistency of the resistance may result.

Further understanding of the structural aspects of the resistor 100 may be gained by reference to FIGS. 2-7, which show various sectional views of the resistor 100 indicated by cutlines 2-2, 3-3, 4-4 and 5-5 in FIG. 1.

Figure 2:
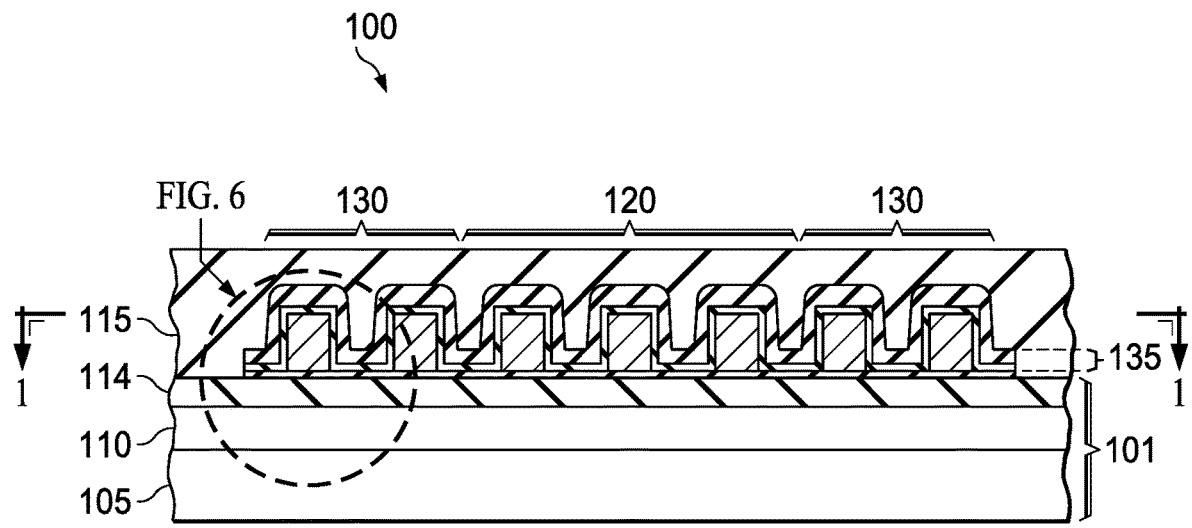
FIG. 2 is a section view of the polysilicon resistor taken at the corresponding cutline of FIG. 1.

FIG. 2 shows a section at cutline 2-2 of FIG. 1 through the portion of the segments 120 and 130 that is covered by the SiBLK layer 135. First it is noted that the substrate 101 on which the resistor 100 is formed includes a semiconductor wafer 105, e.g. a silicon wafer, and further includes an optional epitaxial ("epi") layer 110. Herein references to the "substrate" include embodiments in which the epi layer 110 is present, and those in which the epi layer 110 is absent. Examples may be described herein including the epi layer 110 without implied limitation thereto. FIG. 2 also shows an optional surface isolation structure 114, e.g. a shallow trench isolation (STI) structure, that may conductively isolate the resistor 100 from the substrate 101. In some cases a LOCOS field oxide may be used in lieu of an STI structure. In some other embodiments the resistor 100 may be formed over a doped well region that is electrically configured to isolate the resistor 100 from the substrate by a depleted region under the resistor 100. The segments 120, 130 are shown embedded in the dielectric layer 115, which is sometimes referred to as a poly-metal or pre-metal dielectric layer, or PMD for brevity.

Figure 6:
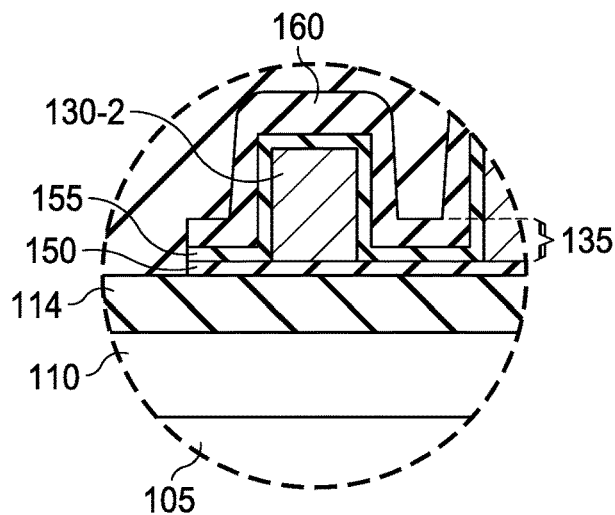
FIG. 6 is a detail view corresponding to the marked portion of FIG. 2.
Figure 7:
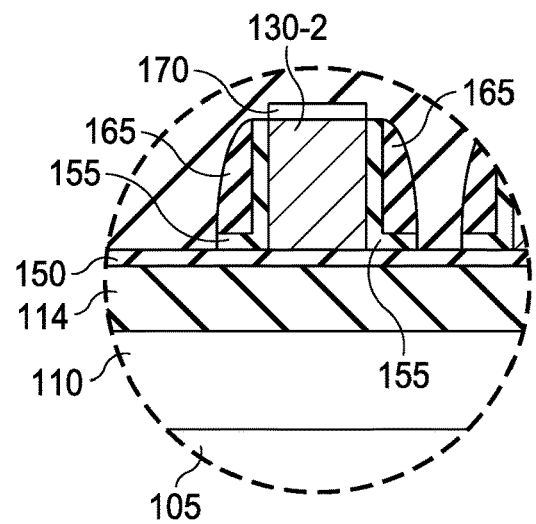
FIG. 7 is a detail view corresponding to the marked portion of FIG. 3.

Referring to FIG. 6, a detail of FIG. 2 is shown as marked in that figure, featuring a single segment 130, e.g. 130-2. A dielectric layer 150, e.g. silicon oxide, is located between the segment 130-2 and the epi layer 110. The dielectric layer 150 may operate as a gate oxide layer in MOS transistors located on portions of the epi layer 110 located outside the current view. Another dielectric layer 155 is located over the segment 130-2 and the dielectric layer 150. The dielectric layer 155 may serve as a liner dielectric on MOS transistor gates outside the view of the figure. Those skilled in the pertinent art will appreciate that the precise nature of the dielectric layer 155 may be determined in part by the requirements of the specific implementation. In some examples, the liner may include two or more sublayers, e.g., a first oxide layer, a nitride layer, and a second oxide layer. Furthermore, a portion of one or more of the sublayers may be removed incidental to other processes related to the fabrication of features over the substrate 101. A dielectric layer 160 is located over the dielectric layer 155. The dielectric layer 155 and the dielectric layer 160 together form the SiBLK layer 135. In other implementations, not shown, the SiBLK layer 135 includes only one dielectric layer. As mentioned previously the SiBLK layer 135 may serve to prevent formation of a silicide on protected portions of underlying polysilicon. Additionally, the SiBLK layer 135 may be used to form portions of gate sidewall spacers in MOS transistors outside the present view. The SiBLK layer 135 may be initially formed as a blanket layer, and masked by a photoresist pattern and selectively removed to produce the perimeter shown in FIG. 1. Where the photoresist is not present gate sidewall spacers may be formed on gate structures. Such structures may also be formed on sidewalls of polysilicon features that are not associated with a transistor, such as the shaded portions of the segments 120 and 130.

In various embodiments the dielectric layer 160 has a different chemical composition than the dielectric layer 155, e.g. to provide etch selectivity between these layers. In various implementations the dielectric layer 160 comprises silicon and nitrogen, and substantially excludes oxygen.

Such material may be referred to as silicon nitride, SiN or SiN$_x$ reflecting the possibility that the material may not have the exact stoichiometry of the material described by the empirical formula Si$_3$N$_4$. In various implementations the dielectric layer 155 comprises silicon and oxygen, and substantially excludes nitrogen. Such material may be referred to as silicon oxide, SiO or SiO$_x$ reflecting the possibility that the material may not have the exact stoichiometry of the material described by the empirical formula SiO$_2$. In some implementations one of the dielectric layer 155 and the dielectric layer 160 comprises silicon, oxygen and nitrogen. Such material may be referred to as silicon oxynitride, SiON or SiO$_x$N$_y$ reflecting the possibility that the material may not have a precisely defined stoichiometry. When the SiBLK layer 135 is a single, homogeneous dielectric material, the SiBLK layer may comprise SiO, SiN or SiON.

Figure 3:
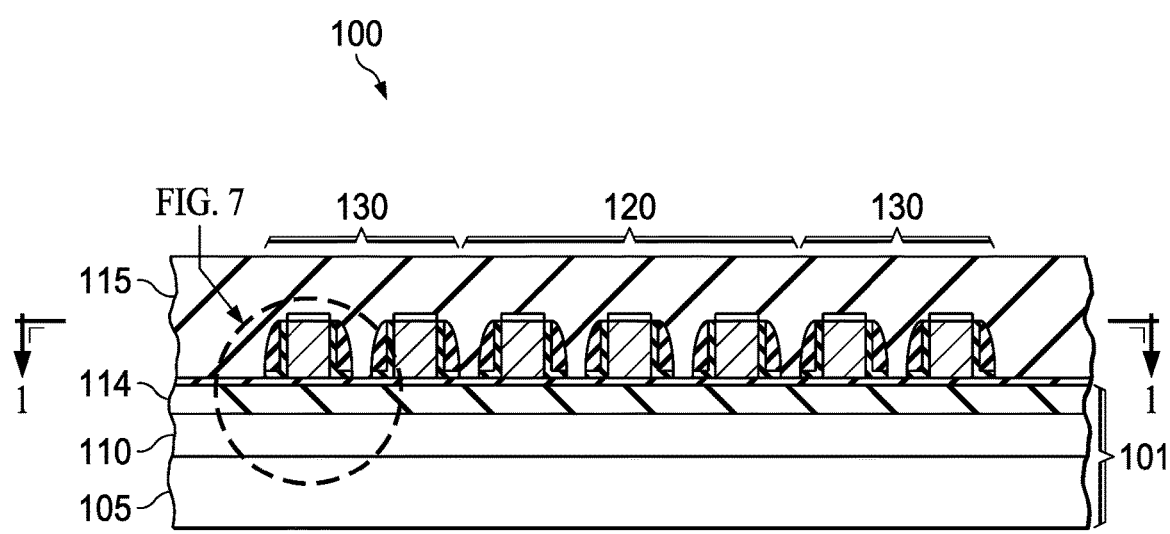
FIG. 3 is a section view of the polysilicon resistor taken at the corresponding cutline of FIG. 1.

Referring now to FIG. 3, this figure shows a section at the cutline 3-3 through a portion of the segments 120 and 130 as marked in FIG. 1 that is not covered by the SiBLK layer 135. Referring to the detail view in FIG. 7, sidewall spacers 165 are present on the segment 130-2 sidewall due to removal of the dielectric layer 160 in this area. Furthermore, the segment 130-2 has been exposed by the removal of the dielectric layer 155 where that layer is not protected by the sidewall spacers 165. More generally the segments 120 and 130 (see FIG. 3) are exposed by the removal of the dielectric layer 155, makes the exposed surface available to react with a metal, e.g. during a silicidation process performed as part of a process used to form gates of MOS transistors located elsewhere on the substrate 105. The reaction results in a silicide layer 170 located on the top surface of the unprotected portion of the segment 130-2 and the others of the segments 120 and 130.

Figure 4:
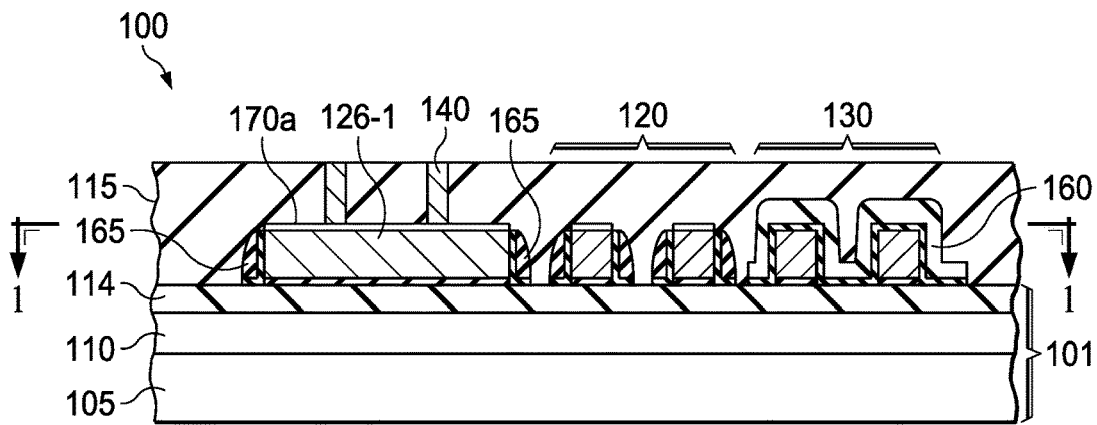
FIG. 4 is a section view of the polysilicon resistor taken at the corresponding cutline of FIG. 1.

FIG. 4 illustrates the device 100 at the cutline 4-4 marked in FIG. 1 through the terminal 126-1, the resistor segments 120-2, 120-3 and the dummy segments 130-3 and 130-4. Note that the cutline 4-4 is offset to capture the illustrated sections. At this location the sidewall spacers 165 are present on sidewalls of the terminal 126-1 and two segments 120. Silicide is also present on the top surfaces of these features, as they are not protected by the SiBLK layer 135 at this location. The silicide layer over the terminal 126-1 is designated silicide layer 170a, and extends from the polysilicon terminal 126-1 toward the SiBLK layer 135 over the segments 120-1, 130-1 and 130-2. This aspect is further illustrated in FIG. 1, which also shows a silicide layer 170b similarly situated with respect to the segments 120-3, 130-3 and 130-4. Also shown in FIG. 4 are the vias 140 (or contacts) and interconnect line 145. The vias 140 make ohmic contact with the terminal 126-1 by way of the silicide layer 170a.

Figure 5A:
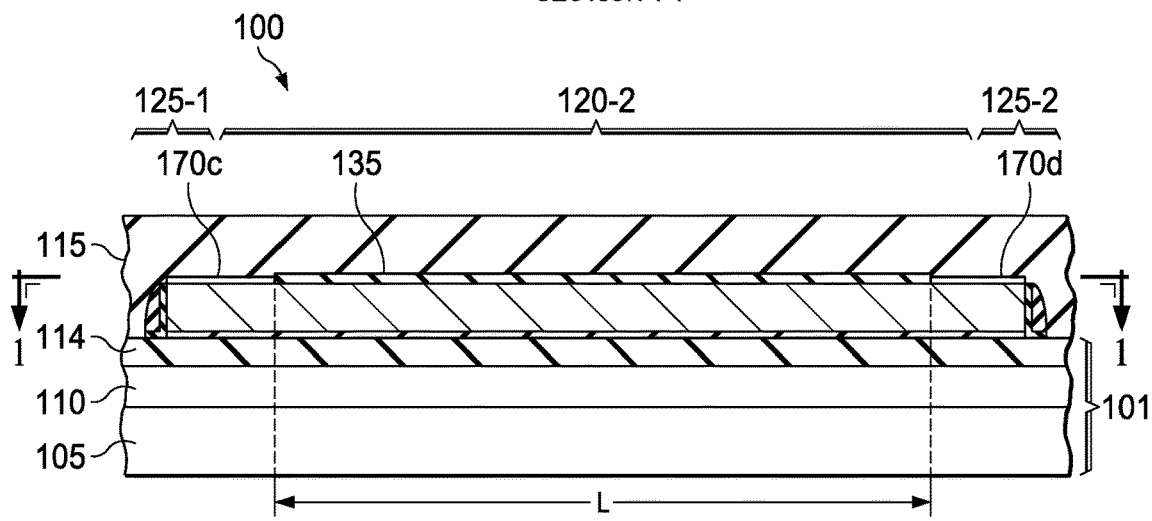
FIGS. 5A and 5B are section views of the polysilicon resistor taken at the corresponding cutlines of FIG. 1.

FIG. 5A illustrates the device 100 at the cutline 5A-5A marked in FIG. 1 through the segment 120-2, the headers 125-1, 125-2, and the silicide layers 170c, 170d. A portion of the segment 120-2 that has a length L is covered by the SiBLK layer 135, and therefore the silicide layer 170 is not present. The uncovered portion of the segment 130-2 has a nontrivial resistance that is substantially linearly proportional to the length L. Conversely, the portions of the segment 130-2 covered by the silicide layers 170c, 170d have small resistance due to the low resistivity of the silicide layers 170c, 170d. Thus the resistance of the silicided portions of the segment 130-2 may be neglected when the resistance of the covered portion sufficiently exceeds that of the covered portions. For example, it may be preferable that the resistance of the uncovered portion exceed the combined resistance of the covered portions by at least ten times, more preferably by at least 100 times.

Because the resistance of the segment 120-2 is determined predominantly by the overlap length L of the SiBLK layer 135, the resistance is expected to be substantially independent of manufacturing variations of the polysilicon components of the resistor 100 not covered by the SiBLK layer 135.

Figure 5B:
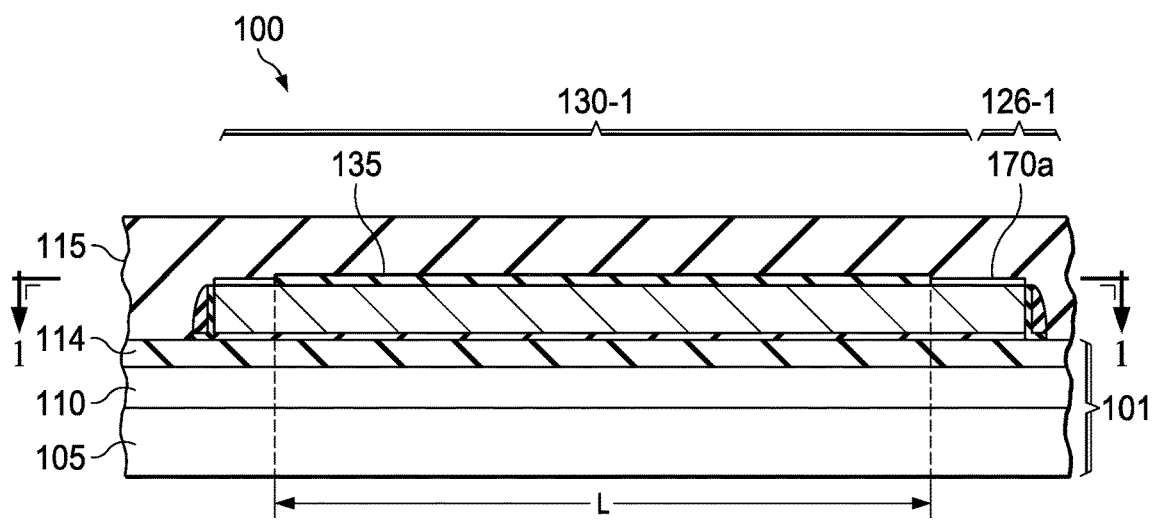

FIG. 5B illustrates the device 100 at the cutline 5B-5B marked in FIG. 1 through the dummy segment 130-1, the terminal 126-1, and the silicide layer 170a. An unreferenced silicide portion is located on the segment 130-1 on the end opposite the end at which the segment 130-1 is connected to the terminal 126-1. An unreferenced sidewall spacer is located at the unconnected end of the segment 130-1. In some implementations, not shown, in which the end of the segment 130-1 opposite the terminal 126-1 is connected to a dummy header, the segment 130-1 terminates at the dummy header.

Figure 9:
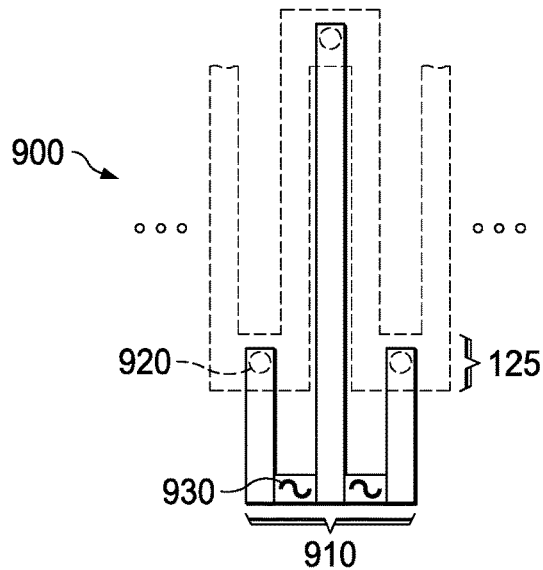
FIG. 9 illustrates a fuse network that bypasses one or more segments of a polysilicon resistor, that may be used, e.g., to adjust the resistance of the resistor.

FIG. 9 illustrates an embodiment, e.g. a resistor 900, in which adjacent ones of the headers 125 are optionally conductively shorted together via a fuse network 910. The network 910 may be implemented in a metal interconnect layer, with vias 920 connecting each terminal of fuses 930 to a corresponding one of the headers 125. In this manner the resistor segment between the corresponding pairs of headers is bypassed and does not contribute significantly to the resistance of the resistor 900. The fuses may be opened ("blown") using, e.g. a conventional laser-based process. By opening an appropriate combination of the fuses 930 the resistance of the resistor 900 may be adjusted, e.g. increased, to achieve a desired target value, such as a nominal design resistance. In this manner resistance variability in a population of nominally identical resistors that remains after employing the previously described solutions may be further reduced. While the illustrated example shows adjacent headers 125 connected via the fuse network 910, in other implementations nonadjacent headers 125 may be connected, with or without intervening headers 125 being connected. Moreover, in some other implementations connections may be made from the fuse network 910 by vias (contacts) that land directly on one or more of the segments 120 between corresponding headers 125.

Turning to FIGS. 8A-8M, an integrated circuit 800 that includes the resistor 100 and a transistor 801 are shown at successive stages of formation over the substrate 101 in a composite sectional view corresponding to cutline 4-4 of FIG. 1. The transistor 801 is representative of any electronic device that may be formed on the substrate 101 in a manner compatible with the process steps used to form the resistor 100. The process steps shown may be performed by conventional or newly-developed techniques. While the resistor 100 and transistor 801 are described as being formed in or over the silicon substrate 101, it will be immediately apparent that the principles described herein may applied to other substrate types.

Figure 8A:
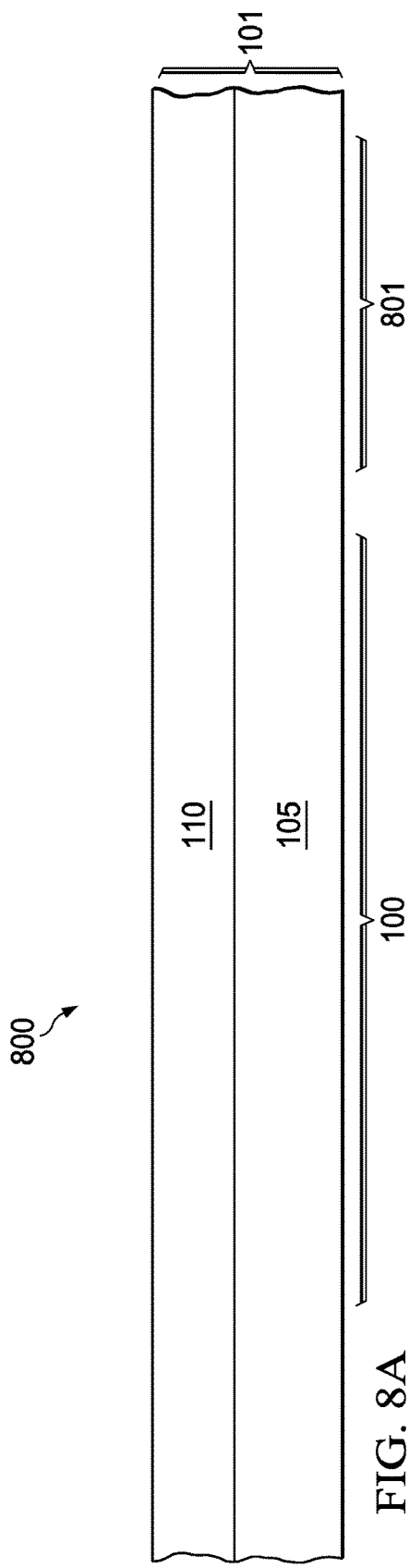

FIG. 8A show the integrated circuit 800 at an early stage of manufacturing, at which point the epi layer 110 has been formed over the semiconductor wafer 105. In the following discussion the wafer 105 and the epi layer 110 may be referred to as p-type with the understanding that the described principles may be applied with similar utility in devices formed over an n-type epi layer and/or an n-type wafer.

Figure 8B:
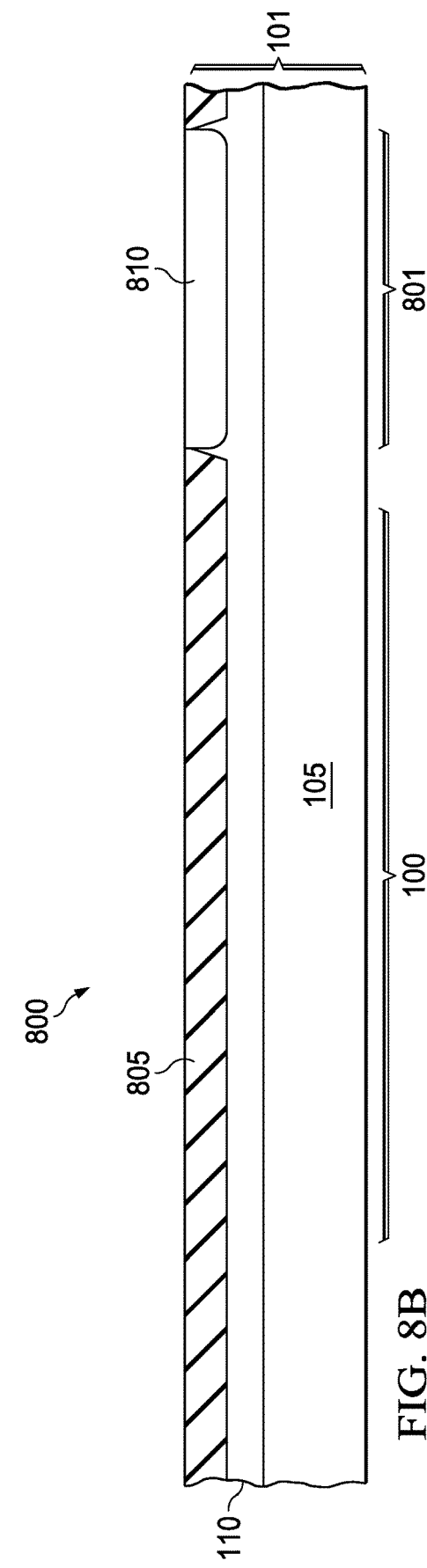

FIG. 8B illustrates the integrated circuit 800 after formation of isolation regions 805 and a doped well region 810. The well region 810 may be an n-well in the case that the transistor 801 is a PMOS transistor. This discussion proceeds without implied limitation with this example.

Figure 8C:
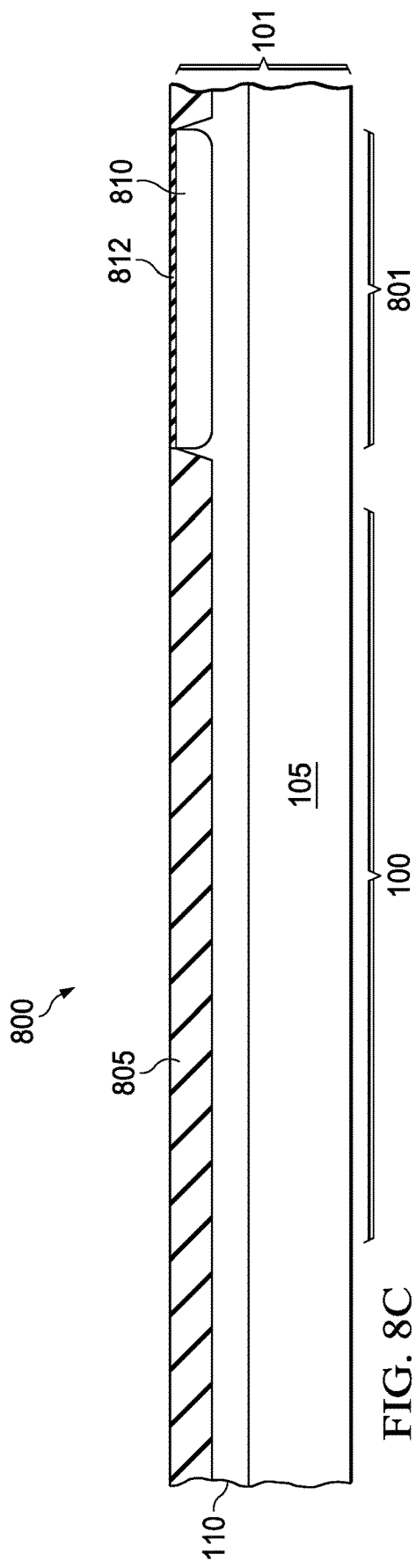

FIG. 8C illustrates the integrated circuit 800 after growth of a gate oxide layer 812 over the well region 810, such as by steam oxidation in a furnace process. The oxidation process may also increase the thickness of the isolation regions 805 as illustrated.

Figure 8D:
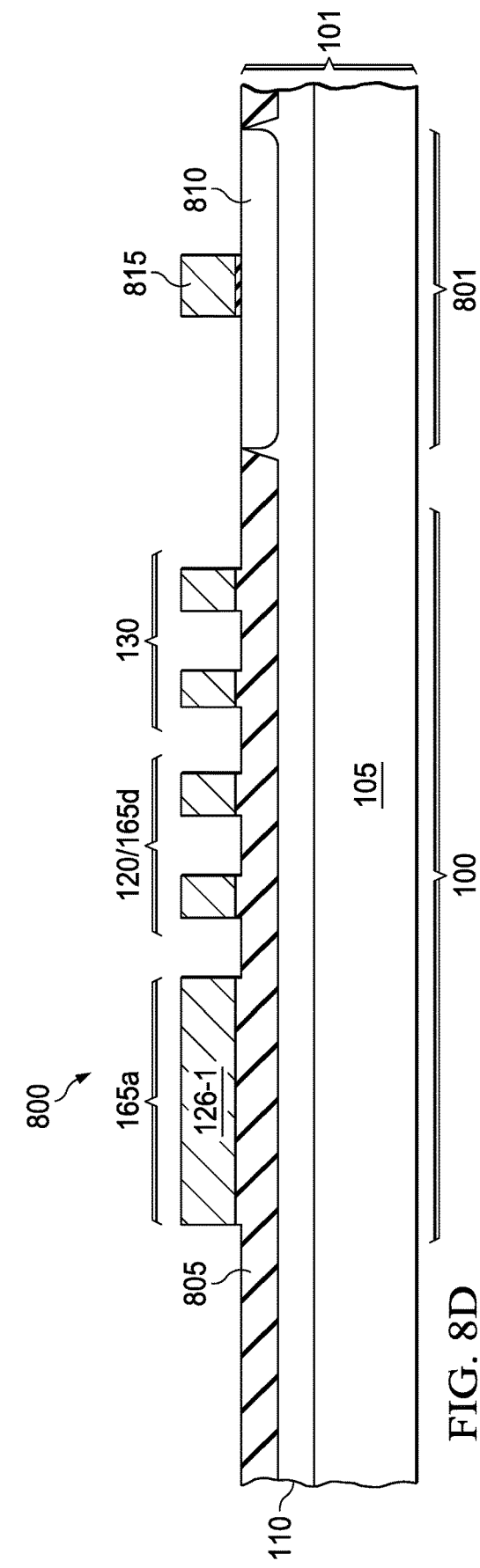

In FIG. 8D a polysilicon layer has been deposited over the isolation regions 805 and the well region 810, and patterned to produce conductive features of the resistor 100 and the transistor 801. The features of the resistor 100 include the terminal 126-1, the resistor segments 120 and the dummy segments 130. The features of the transistor 801 include a gate electrode 815 and an unreferenced gate dielectric between the gate electrode 815 and the well region 810. The polysilicon layer may be selectively doped to provide a desired resistivity of polysilicon features in the resistor 100, and in the transistor 801.

FIG. 8E illustrates the integrated circuit after additional processing that forms lightly doped regions, e.g. p-type, adjacent the gate electrode 815 and then forms a liner oxide 820 and a silicon nitride layer 825 over the polysilicon structures. The liner oxide 820 and a silicon nitride layer 825 together form a SiBLK layer 826. The liner oxide is illustrated as a single layer, which may be representative of various alternate implementations, such as, e.g. poly (smile) grown oxide, offset oxide, and/or nitride.

FIG. 8F illustrates the integrated circuit 800 after a selective etchback of the silicon nitride layer 825. A patterned resist layer (not shown) is used to protect the silicon nitride layer 825 in the region of the resistor 100 corresponding to the SiBLK layer 135. A blanket etch of the exposed silicon nitride produces sidewall spacers 830 on sidewalls of polysilicon features outside the SiBLK layer 135. Thus sidewall spacers 830 are shown on the terminal 126-1, the resistor segments 120 and the gate electrode 815. Note that the sections of the resistor segments 120 shown in FIG. 8F are taken outside the SiBLK layer 135, while the sections of the dummy segments 130 are taken inside the SiBLK layer 135. (See FIG. 1.) Thus the section view of the dummy segments 130 is representative of the resistor segments 120 protected by the SiBLK layer 135.

Figure 8G:
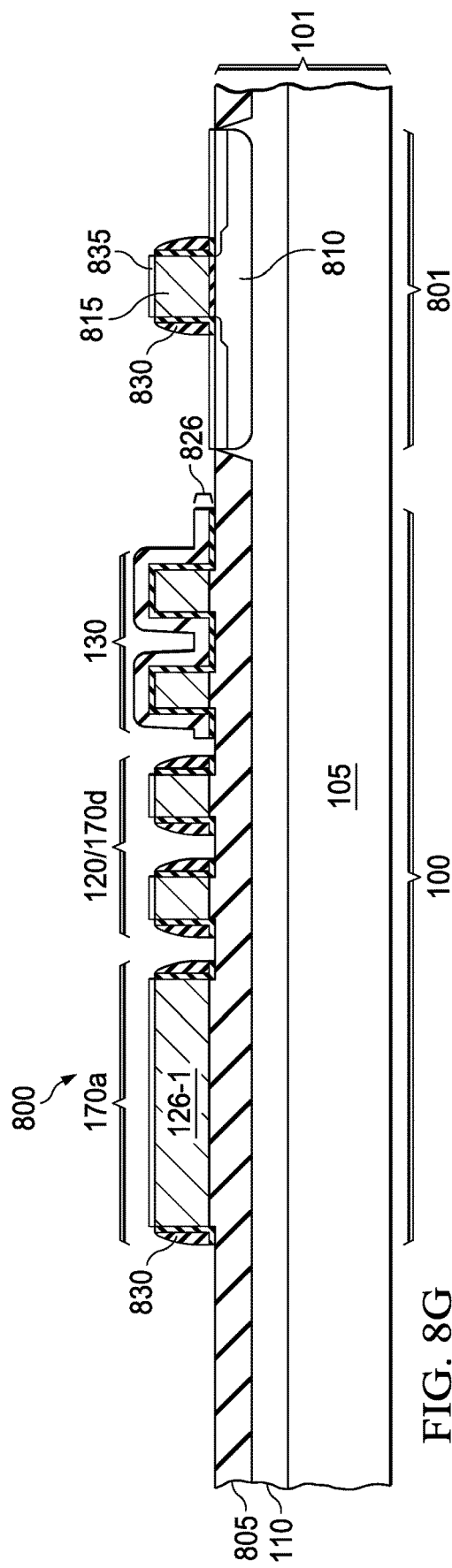

FIG. 8G illustrates the integrated circuit after additional processing that forms source/drain regions, e.g. p-type, of the transistor 801, followed by formation of a metal silicide on exposed silicon surfaces of the polysilicon features and the source/drain regions of the transistor 801. The metal silicide may be or include, for example and without implied limitation, a binary compound such as $WSi_2$, $CoSi_2$, $TiSi_2$, $TaSi_2$, or NiSi, or a ternary system such as Ni(Pt)Si. The silicide formation results in the silicide layer 170a on the terminal 126-1 and the silicide layer 170d on portions of the resistor segments 120, as well as silicide layers 835 on the terminals of the transistor 801. The silicide is not formed on portions of the resistor segments 120 and dummy segments 130 that are protected by the SiBLK layer 135.

Optionally, the SiBLK layer 135 may be formed after the formation of the sidewall spacers 130, and after anneal of the source/drain regions, but before forming the silicide layers 170a, 170b and 835. In such implantations, sidewall spacers may be present on the sidewalls of the segments 120, 130.

Figure 8H:
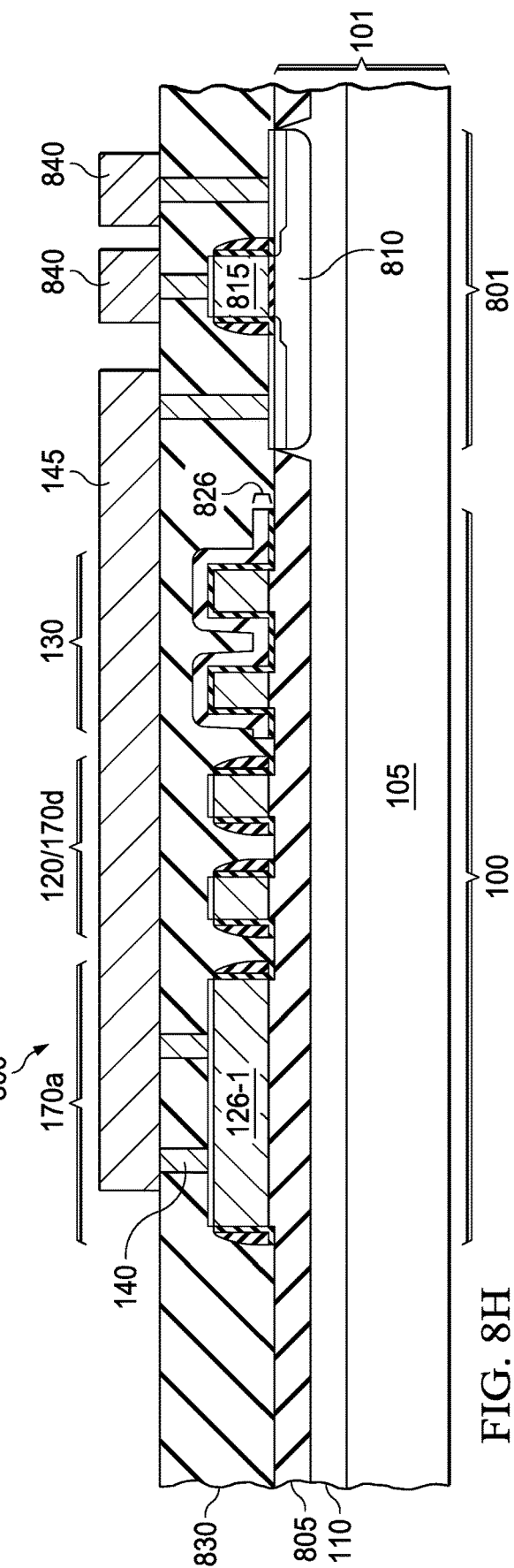

FIG. 8H provide a sectional view of the integrated circuit 800 after forming a dielectric layer 830 over the resistor 100 and the transistor 801 and subsequent formation of interconnects. The vias 140 connect the terminal 126-1 to the interconnect line 145, which in turn connect to a terminal of the transistor 801 by way of another unreferenced via. Additional metal lines 840 connect other terminals of the transistor to further circuitry on the substrate 101.

While various embodiments of the present disclosure have been described above, it should be understood that they have been presented by way of example only and not limitation. Numerous changes to the disclosed embodiments can be made in accordance with the disclosure herein without departing from the spirit or scope of the disclosure. Thus, the breadth and scope of the present invention should not be limited by any of the above described embodiments. Rather, the scope of the disclosure should be defined in accordance with the following claims and their equivalents.

The invention claimed is:

1. A method of forming an integrated circuit, comprising:
   forming a plurality of segments of a polysilicon resistor over a semiconductor substrate, including first, second and third segments, the second segment located between and running about parallel to the first and third segments;
   forming a first header that connects the first and second segments, and a second header that connects the second and third segments;
   forming a first metal silicide layer located over the first header and extending over the first and second segments toward the second header;
   forming a second metal silicide layer located over the second header and extending over the second and third segments toward the first header; and
   forming a dielectric layer located over and in contact with the first, second and third segments between the first and second metal silicide layers.

2. The method of claim 1, further comprising forming a first polysilicon terminal connected to the first segment, and forming a fourth segment connected at one end to the first polysilicon terminal and unconnected at an opposite end.

3. The method of claim 2, further comprising forming a second polysilicon terminal connected to the second segment, and forming a fifth segment connected at one end to the second polysilicon terminal and unconnected at an opposite end.

4. The method of claim 2, wherein the dielectric layer is located over and in contact with the fourth segment.

5. The method of claim 1, wherein the first metal silicide layer extends over the first segment from the first header to the dielectric layer.

6. The method of claim 1, further comprising conductively one of the segments to another of the segments via a fusible link.

7. The method of claim 1, wherein the dielectric layer is a first dielectric material, and further comprising forming a second different dielectric material over and in contact with the first dielectric material.

8. The method of claim 7, wherein the first dielectric material comprises $SiN_x$ and the second dielectric material comprises $SiO_x$.

9. The method of claim 2, further comprising forming a transistor in or over the substrate, and conductively connecting the first polysilicon terminal to a terminal of the transistor.

10. The method of claim 1, wherein the dielectric layer is continuous between the first header and the second header.

11. The method of claim 1, wherein the dielectric layer is formed directly on sidewalls of the plurality of segments.

12. A method of forming an integrated circuit, comprising:
   forming first and second polysilicon terminals over a semiconductor substrate;

forming a polysilicon line having first and second ends and being connected between the first and second terminals;

forming a dielectric layer located over and in contact with the polysilicon line, the dielectric layer extending uninterrupted along a long axis of the polysilicon line from a first location on the line to a second location on the line; and forming first and second metal silicide layers located over and in contact with the polysilicon line, the first metal silicide layer extending uninterrupted from the first end of the polysilicon line to the first location on the line, and the second metal silicide layer extending uninterrupted from the second end of the polysilicon line to the second location on the line.

13. The method of claim 12, wherein the polysilicon line is a first polysilicon line and further comprising forming a second polysilicon line having first and second ends, the first end of the second polysilicon line being directly connected to the first terminal, and the second end being unconnected.

14. The method of claim 13, wherein the dielectric layer is located over and in contact with the second polysilicon line.

15. A method of forming an integrated circuit, comprising:

forming a plurality of segments of a polysilicon resistor, including first and second segments separated by a spacing distance;

forming a header connected to at least the first segment;

forming a first terminal connected to the first segment and a second terminal connected to the second segment; and forming a dummy segment connected to the first terminal, the dummy segment spaced from the first segment by the spacing distance.

16. The method of claim 15, wherein the plurality of segments and the header provide a serpentine current path.

17. The method of claim 15, further comprising:

forming a dielectric layer located over and in contact with the first and second segments and the dummy segment, the dielectric layer extending uninterrupted along a long axis of the first and second segments and a long axis of the dummy segment; and forming first and second metal silicide layers located over and in contact with the first segment, the first metal silicide layer extending uninterrupted from a first end of the first segment to the dielectric layer, and the second metal silicide layer extending uninterrupted from a second opposite end of the first segment to the dielectric layer.

18. The method of claim 15, further comprising:

forming a first metal silicide layer over the header and extending over the first and second segments;

forming a second metal silicide layer over the first terminal and extending over the first segment and the dummy segment;

forming a third metal silicide layer over the dummy segment at an end opposite the first terminal and extending over the dummy segment toward the first terminal; and forming a continuous dielectric layer located over and in contact with the first segment between the header and the first terminal and located over and in contact with the dummy segment between the second metal silicide layer and the third metal silicide layer.

* * * * *